United States Patent
Bassov et al.

(10) Patent No.: US 11,232,075 B2
(45) Date of Patent: Jan. 25, 2022

(54) SELECTION OF HASH KEY SIZES FOR DATA DEDUPLICATION

(71) Applicant: EMC IP Holding Company LLC, Hopkinton, MA (US)

(72) Inventors: Ivan Bassov, Brookline, MA (US); Sorin Faibish, Newton, MA (US); Rustem Rafikov, Hopkinton, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 569 days.

(21) Appl. No.: 16/170,421

(22) Filed: Oct. 25, 2018

(65) Prior Publication Data

US 2020/0134049 A1 Apr. 30, 2020

(51) Int. Cl.
| | | |
|---|---|---|
| *G06F 16/00* | (2019.01) | |
| *G06F 16/174* | (2019.01) | |
| *H03M 7/30* | (2006.01) | |
| *G06F 16/13* | (2019.01) | |

(52) U.S. Cl.
CPC ........ *G06F 16/1752* (2019.01); *G06F 16/137* (2019.01); *G06F 16/1744* (2019.01); *H03M 7/3091* (2013.01)

(58) Field of Classification Search
CPC ............... G06F 16/1752; G06F 16/137; G06F 16/1744; H03M 7/3091
USPC ....................................................... 707/692
See application file for complete search history.

(56) References Cited

U.S. PATENT DOCUMENTS

| | | | | | |
|---|---|---|---|---|---|
| 5,371,499 | A | * | 12/1994 | Graybill ................. | G06T 9/005 341/106 |
| 9,559,889 | B1 | * | 1/2017 | Vincent ............... | H04L 67/2842 |
| 2008/0025298 | A1 | * | 1/2008 | Lev-Ran ................ | H04L 69/04 370/389 |
| 2012/0242517 | A1 | * | 9/2012 | Seo ......................... | H03M 7/40 341/52 |
| 2013/0135123 | A1 | * | 5/2013 | Golander ............ | H03M 7/3086 341/65 |
| 2014/0195498 | A1 | * | 7/2014 | Asher .................. | H03M 7/607 707/693 |

(Continued)

OTHER PUBLICATIONS

Kedarnath J. Balakrishnan, et al., "Relationship Between Entropy and Test Data Compression," IEEE Transactions on Computer-Aided Design of Integrated Circuits and Systems, vol. 26, No. 2, Feb. 2007.

(Continued)

*Primary Examiner* — Monica M Pyo
(74) *Attorney, Agent, or Firm* — Muirhead and Saturnelli, LLC

(57) ABSTRACT

Techniques for data processing may include: receiving a data chunk; determining a metric value denoting a degree of compressibility of the data chunk; selecting, in accordance with the metric value denoting the compressibility of the data chunk, a first size of a plurality of sizes, wherein each of the plurality of sizes denotes a different size of an amount of storage used for storing a value of said each size; and performing the data deduplication processing for the data chunk, wherein the data deduplication processing includes using a first hash value for the data chunk to determine whether the data chunk is a duplicate of another data chunk of a hash table, wherein the first hash value is stored in a storage location of the first size.

20 Claims, 9 Drawing Sheets

(56) References Cited

U.S. PATENT DOCUMENTS

2014/0279874 A1* 9/2014 Reiter ............... G06F 11/3414
707/610
2017/0017407 A1* 1/2017 Wei .................. G06F 3/0641

OTHER PUBLICATIONS

"Entropy (information theory)," Wikipedia, https://en.wikipedia.org/wiki/Entropy_(information_theory), Sep. 9, 2018.
Computer Forensics, Malware Analysis & Digital Investigations: File Entropy, "File Entropy explained," http://www.forensickb.com/2013/03/file-entropy-explained.html, Mar. 20, 2013.
Werner Ebeling, et al., "Entropy and Compressibility of Symbol Sequences," PhysComp96, Feb. 23, 1997.
Sorin Faibish, et al., "Concurrent Data Entropy and Digest Computation Operating on Same Data for CPU Cache Efficiency," U.S. Appl. No. 16/043,640, filed Jul. 24, 2018.

* cited by examiner

| Hash key/has value size 702 | Hash function/algorithm 704 |
|---|---|
| 32 bytes | SHA-256 |
| 24 bytes | SHA-256 (24 bytes of 32 byte hash output) |
| 16 bytes | MurmurHash |
| 12 bytes | MurmurHash (12 bytes of 16 byte hash output) |

FIG. 7

SELECTION OF HASH KEY SIZES FOR DATA DEDUPLICATION

BACKGROUND

Technical Field

This application generally relates to data storage and, in particular, selecting sizes of hash keys and associated hash values or digests.

Description of Related Art

Systems may include different resources used by one or more host processors. Resources and host processors in the system may be interconnected by one or more communication connections, such as network connections. These resources may include, for example, data storage devices such as those included in the data storage systems manufactured by Dell Inc. These data storage systems may be coupled to one or more host processors and provide storage services to each host processor. Multiple data storage systems from one or more different vendors may be connected and may provide common data storage for one or more host processors in a computer system.

A host may perform a variety of data processing tasks and operations using the data storage system. For example, a host may issue I/O operations, such as data read and write operations, received at a data storage system. Host systems may store and retrieve data by issuing the I/O operations to the data storage system containing a plurality of host interface units, disk drives (or more generally storage devices), and disk interface units. The host systems access the storage devices through a plurality of channels provided therewith. Host systems provide data and access control information through the channels to a storage device of the data storage system and data of the storage device is also provided from the data storage system to the host systems also through the channels. The host systems do not address the disk drives of the data storage system directly, but rather, access what appears to the host systems as a plurality of files, objects, logical units, logical devices or logical volumes. Thus, the I/O operations issued by the host may be directed to a particular storage entity, such as a file or logical device. The logical devices may or may not correspond to the actual physical drives. Allowing multiple host systems to access the single data storage system allows the host systems to share data stored therein.

SUMMARY OF THE INVENTION

In accordance with one aspect of the techniques herein is a method of processing data comprising: receiving a data chunk; determining a metric value denoting a degree of compressibility of the data chunk; selecting, in accordance with the metric value denoting the compressibility of the data chunk, a first size of a plurality of sizes, wherein each of the plurality of sizes denotes a different size of an amount of storage used for storing a value of said each size; and performing the data deduplication processing for the data chunk, wherein the data deduplication processing includes using a first hash value for the data chunk to determine whether the data chunk is a duplicate of another data chunk of a hash table, wherein the first hash value is stored in a storage location of the first size. The metric value may be an entropy value determined for the data chunk. The entropy value may denote a degree of randomness and uniformity of data of the data chunk. The metric value may be a compression ratio determined for the data chunk. The method may include compressing the data chunk using a data compression algorithm; and determining the compression ratio for the data chunk in accordance with a size of a compressed form of the data chunk and a size of an uncompressed form of the data chunk provided as an input to the data compression algorithm. The data deduplication processing for the data chunk may further comprise: mapping the first hash value to a first hash key of the hash table matching the first hash value, wherein the first hash key is used an index into the hash table and wherein the first hash key is a value stored in a storage location of the first size; determining whether there is a first existing data chunk of the hash table matching the data chunk, wherein the first existing data chunk is associated with the first hash key; if it is determined that there is the first existing data chunk of the hash table matching the data chunk, determining that the data chunk is a duplicate of the first existing data chunk and not storing the data chunk as another copy of the first existing data chunk; and if it is determined that there is no existing data chunk of the hash table matching the data chunk, performing first processing including determining that the data chunk is not a duplicate of an existing data chunk of the hash table. If it is determined that there is no existing data chunk of the hash table matching the data chunk, the first processing may further include associating the data chunk with the first hash key of the hash table; and storing the data chunk in a data store. The hash table may be a first hash table and the data store may include a plurality of hash tables including the first hash table, wherein each of the plurality of hash tables may use hash keys of a different one of the plurality of sizes. The method may include using a hash function to generate the first hash value for the data chunk. The hash function may be one of a plurality of different hash functions and wherein the method may include selecting, in accordance with a metric value denoting a degree of compressibility of the data chunk, the hash function from the plurality of hash functions. The hash function may output values including a first value stored in a first storage location having a storage size larger than said first size and wherein the method may include using a portion of the first storage location as the first hash value for the data chunk, wherein the portion has a size of the first size. The method may be performed as part of inline processing of the data chunk in connection with an I/O path or data path when servicing an I/O accessing the data chunk. The method may be performed offline and not as part of inline processing of the data chunk in connection with an I/O path or data path when servicing an I/O accessing the data chunk.

In accordance with another aspect of the techniques herein is a system comprising: a processor; and a memory comprising code stored thereon that, when executed, performs a method of processing data comprising: receiving a data chunk; determining a metric value denoting a degree of compressibility of the data chunk; selecting, in accordance with the metric value denoting the compressibility of the data chunk, a first size of a plurality of sizes, wherein each of the plurality of sizes denotes a different size of an amount of storage used for storing a value of said each size; and performing the data deduplication processing for the data chunk, wherein the data deduplication processing includes using a first hash value for the data chunk to determine whether the data chunk is a duplicate of another data chunk of a hash table, wherein the first hash value is stored in a storage location of the first size.

In accordance with another aspect of the techniques herein is a computer readable medium comprising code stored thereon that, when executed, performs a method of processing data comprising: receiving a data chunk; determining a metric value denoting a degree of compressibility of the data chunk; selecting, in accordance with the metric value denoting the compressibility of the data chunk, a first size of a plurality of sizes, wherein each of the plurality of sizes denotes a different size of an amount of storage used for storing a value of said each size; and performing the data deduplication processing for the data chunk, wherein the data deduplication processing includes using a first hash value for the data chunk to determine whether the data chunk is a duplicate of another data chunk of a hash table, wherein the first hash value is stored in a storage location of the first size. The metric value may be an entropy value determined for the data chunk. The entropy value may denote a degree of randomness and uniformity of data of the data chunk. The metric value may be a compression ratio determined for the data chunk. The method may include: compressing the data chunk using a data compression algorithm; and determining the compression ratio for the data chunk in accordance with a size of a compressed form of the data chunk and a size of an uncompressed form of the data chunk provided as an input to the data compression algorithm. The data deduplication processing for the data chunk may further comprise: mapping the first hash value to a first hash key of the hash table matching the first hash value, wherein the first hash key is used an index into the hash table and wherein the first hash key is a value stored in a storage location of the first size; determining whether there is a first existing data chunk of the hash table matching the data chunk, wherein the first existing data chunk is associated with the first hash key; if it is determined that there is the first existing data chunk of the hash table matching the data chunk, determining that the data chunk is a duplicate of the first existing data chunk and not storing the data chunk as another copy of the first existing data chunk; if it is determined that there is no existing data chunk of the hash table matching the data chunk, performing first processing that may include: determining that the data chunk is not a duplicate of an existing data chunk of the hash table; associating the data chunk with the first hash key of the hash table; and storing the data chunk in a data store.

BRIEF DESCRIPTION OF THE DRAWINGS

Features and advantages of the present invention will become more apparent from the following detailed description of exemplary embodiments thereof taken in conjunction with the accompanying drawings in which:

FIG. 7 is an example illustrating different hash functions or algorithms that may be used in an embodiment in accordance with techniques herein.

DETAILED DESCRIPTION OF EMBODIMENT(S)

Figure 1:
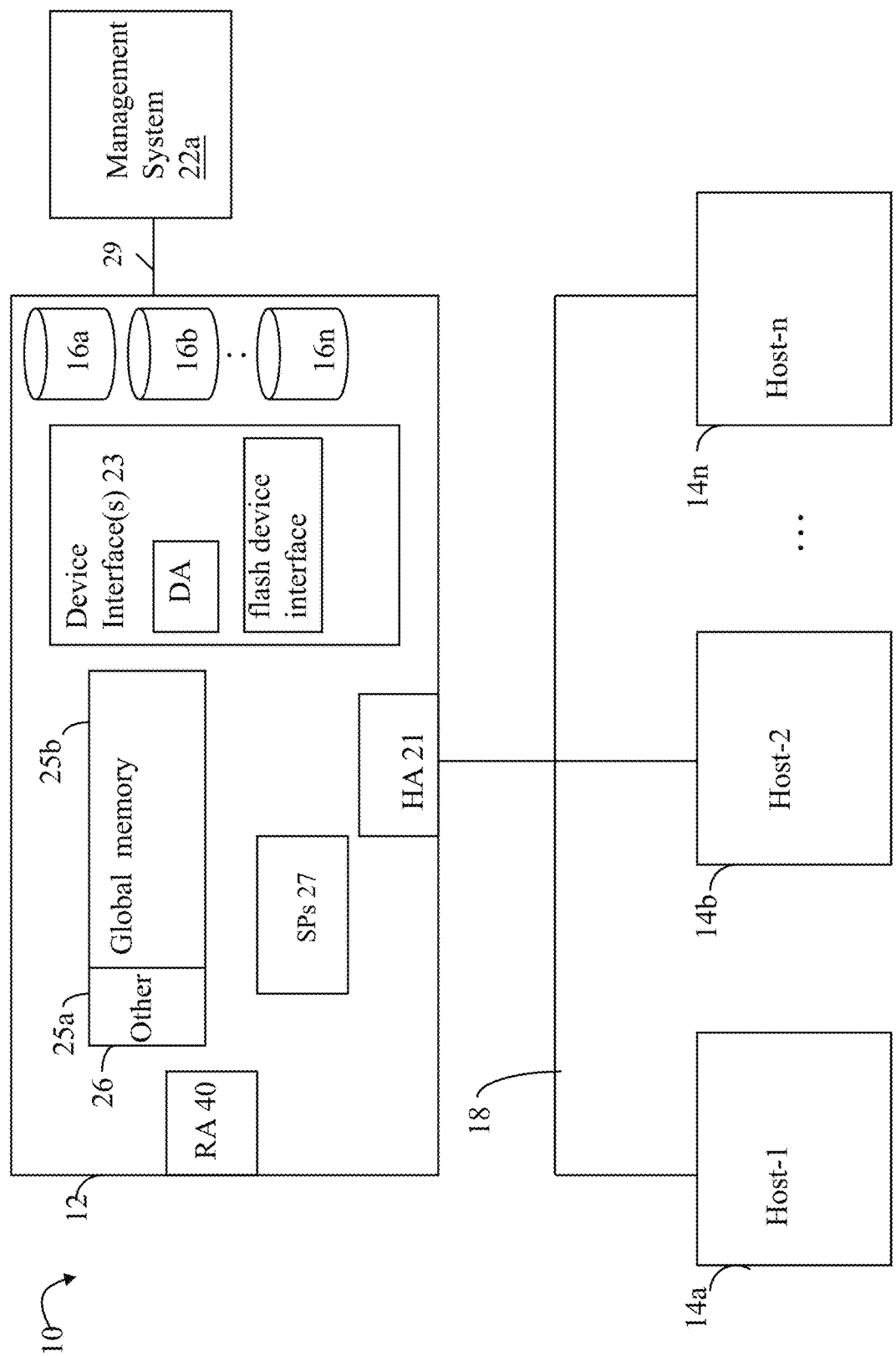
FIGS. 1 and 2B are examples of components that may be included in a system in accordance with techniques described herein.

Referring to FIG. 1, shown is an example of an embodiment of a system that may be used in connection with performing the techniques described herein. The system 10 includes a data storage system 12 connected to host systems 14a-14n through communication medium 18. In this embodiment of the computer system 10, and the n hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network (including a Storage Area Network (SAN)) or other wireless or other hardwired connection(s) by which the host systems 14a-14n may access and communicate with the data storage system 12, and may also communicate with other components included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host computer systems 14a-14n may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage system 12 are described herein in more detail, and may vary with each particular embodiment. Each of the host computers 14a-14n and data storage system may all be located at the same physical site, or, alternatively, may also be located in different physical locations. Examples of the communication medium that may be used to provide the different types of connections between the host computer systems and the data storage system of the system 10 may use a variety of different communication protocols such as block-based protocols (e.g., SCSI, Fibre Channel, iSCSI), file system-based protocols (e.g., NFS), and the like. Some or all of the connections by which the hosts and data storage system may be connected to the communication medium may pass through other communication devices, such switching equipment that may exist such as a phone line, a repeater, a multiplexer or even a satellite.

Each of the host computer systems may perform different types of data operations in accordance with different types of tasks. In the embodiment of FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12.

It should be noted that although element 12 is illustrated as a single data storage system, such as a single data storage array, element 12 may also represent, for example, multiple data storage arrays alone, or in combination with, other data storage devices, systems, appliances, and/or components having suitable connectivity, such as in a SAN (storage area network) or LAN (local area network), in an embodiment using the techniques herein. It should also be noted that an embodiment may include data storage arrays or other components from one or more vendors. In subsequent examples illustrated the techniques herein, reference may be made to a single data storage array by a vendor. However, as will be appreciated by those skilled in the art, the techniques herein are applicable for use with other data storage arrays by other vendors and with other components than as described herein for purposes of example.

The data storage system 12 may be a data storage appliance or a data storage array including a plurality of data storage devices (PDs) 16a-16n. The data storage devices 16a-16n may include one or more types of data storage devices such as, for example, one or more rotating disk drives and/or one or more solid state drives (SSDs). An SSD is a data storage device that uses solid-state memory to store persistent data. SSD may refer to solid state electronics devices as distinguished from electromechanical devices, such as hard drives, having moving parts. Flash devices or flash memory-based SSDs are one type of SSD that contains no moving mechanical parts. The flash devices may be constructed using nonvolatile semiconductor NAND flash memory. The flash devices may include, for example, one or more SLC (single level cell) devices and/or MLC (multi level cell) devices.

The data storage array may also include different types of adapters or directors, such as an HA 21 (host adapter), RA 40 (remote adapter), and/or device interface 23. Each of the adapters may be implemented using hardware including a processor with local memory with code stored thereon for execution in connection with performing different operations. The HAs may be used to manage communications and data operations between one or more host systems and the global memory (GM). In an embodiment, the HA may be a Fibre Channel Adapter (FA) or other adapter which facilitates host communication. The HA 21 may be characterized as a front end component of the data storage system which receives a request from the host. The data storage array may include one or more RAs that may be used, for example, to facilitate communications between data storage arrays. The data storage array may also include one or more device interfaces 23 for facilitating data transfers to/from the data storage devices 16a-16n. The data storage interfaces 23 may include device interface modules, for example, one or more disk adapters (DAs) (e.g., disk controllers), adapters used to interface with the flash drives, and the like. The DAs may also be characterized as back end components of the data storage system which interface with the physical data storage devices.

One or more internal logical communication paths may exist between the device interfaces 23, the RAs 40, the HAs 21, and the memory 26. An embodiment, for example, may use one or more internal busses and/or communication modules. For example, the global memory portion 25b may be used to facilitate data transfers and other communications between the device interfaces, HAs and/or RAs in a data storage array. In one embodiment, the device interfaces 23 may perform data operations using a system cache that may be included in the global memory 25b, for example, when communicating with other device interfaces and other components of the data storage array. The other portion 25a is that portion of memory that may be used in connection with other designations that may vary in accordance with each embodiment.

The particular data storage system as described in this embodiment, or a particular device thereof, such as a disk or particular aspects of a flash device, should not be construed as a limitation. Other types of commercially available data storage systems, as well as processors and hardware controlling access to these particular devices, may also be included in an embodiment.

Host systems provide data and access control information through channels to the storage systems, and the storage systems may also provide data to the host systems also through the channels. The host systems do not address the drives or devices 16a-16n of the storage systems directly, but rather access to data may be provided to one or more host systems from what the host systems view as a plurality of logical devices, logical volumes (LVs) which may also referred to herein as logical units (e.g., LUNs). A logical unit (LUN) may be characterized as a disk array or data storage system reference to an amount of disk space that has been formatted and allocated for use to one or more hosts. A logical unit may have a logical unit number that is an I/O address for the logical unit. As used herein, a LUN or LUNs may refer to the different logical units of storage which may be referenced by such logical unit numbers. The LUNs may or may not correspond to the actual or physical disk drives or more generally physical storage devices. For example, one or more LUNs may reside on a single physical disk drive, data of a single LUN may reside on multiple different physical devices, and the like. Data in a single data storage system, such as a single data storage array, may be accessed by multiple hosts allowing the hosts to share the data residing therein. The HAs may be used in connection with communications between a data storage array and a host system. The RAs may be used in facilitating communications between two data storage arrays. The DAs may be one type of device interface used in connection with facilitating data transfers to/from the associated disk drive(s) and LUN (s) residing thereon. A flash device interface may be another type of device interface used in connection with facilitating data transfers to/from the associated flash devices and LUN(s) residing thereon. It should be noted that an embodiment may use the same or a different device interface for one or more different types of devices than as described herein.

In an embodiment in accordance with techniques herein, the data storage system as described may be characterized as having one or more logical mapping layers in which a logical device of the data storage system is exposed to the host whereby the logical device is mapped by such mapping layers of the data storage system to one or more physical devices. Additionally, the host may also have one or more additional mapping layers so that, for example, a host side logical device or volume is mapped to one or more data storage system logical devices as presented to the host.

It should be noted that although examples of techniques herein may be made with respect to a physical data storage system and its physical components (e.g., physical hardware for each HA, DA, HA port and the like), techniques herein may be performed in a physical data storage system including one or more emulated or virtualized components (e.g., emulated or virtualized ports, emulated or virtualized DAs or HAs), and also a virtualized or emulated data storage system including virtualized or emulated components.

Also shown in FIG. 1 is a management system 22a that may be used to manage and monitor the system 12. In one embodiment, the management system 22a may be a computer system which includes data storage system management software or application such as may execute in a web browser. A data storage system manager may, for example, view information about a current data storage configuration such as LUNs, storage pools, and the like, on a user interface (UI) in a display device of the management system 22a. Alternatively, and more generally, the management software may execute on any suitable processor in any suitable system. For example, the data storage system management software may execute on a processor of the data storage system 12.

It should be noted that each of the different adapters, such as HA 21, DA or disk interface, RA, and the like, may be implemented as a hardware component including, for example, one or more processors, one or more forms of memory, and the like. Code may be stored in one or more of the memories of the component for performing processing.

The device interface, such as a DA, performs I/O operations on a physical device or drive 16a-16n. In the following description, data residing on a LUN may be accessed by the device interface following a data request in connection with I/O operations. For example, a host may issue an I/O operation which is received by the HA 21. The I/O operation may identify a target location from which data is read from, or written to, depending on whether the I/O operation is, respectively, a read or a write operation request. The target location of the received I/O operation may be expressed in terms of a LUN and logical address or offset location (e.g., LBA or logical block address) on the LUN. Processing may be performed on the data storage system to further map the target location of the received I/O operation, expressed in terms of a LUN and logical address or offset location on the LUN, to its corresponding physical storage device (PD) and location on the PD. The DA which services the particular PD may further perform processing to either read data from, or write data to, the corresponding physical device location for the I/O operation.

It should be noted that an embodiment of a data storage system may include components having different names from that described herein but which perform functions similar to components as described herein. Additionally, components within a single data storage system, and also between data storage systems, may communicate using any suitable technique that may differ from that as described herein for exemplary purposes. For example, element 12 of FIG. 1 may be a data storage system, such as the Dell EMC Unity® data storage system. that includes multiple storage processors (SPs). Each of the SPs 27 may be a CPU including one or more "cores" or processors and each may have their own memory used for communication between the different front end and back end components rather than utilize a global memory accessible to all storage processors. In such embodiments, memory 26 may represent memory of each such storage processor.

Generally, techniques herein may be used in connection with any suitable storage system, appliance, device, and the like, in which data is stored. For example, an embodiment may implement techniques herein using a midrange data storage system, such as a Dell EMC Unity® data storage system, as well as a high end or enterprise data storage system, such as a Dell EMC™ PowerMAX™ data storage system.

The data path or I/O path may be characterized as the path or flow of I/O data through a system. For example, the data or I/O path may be the logical flow through hardware and software components or layers in connection with a user, such as an application executing on a host (e.g., more generally, a data storage client) issuing I/O commands (e.g., SCSI-based commands, and/or file-based commands) that read and/or write user data to a data storage system, and also receiving a response (possibly including requested data) in connection such I/O commands.

The control path, also sometimes referred to as the management path, may be characterized as the path or flow of data management or control commands through a system. For example, the control or management path may be the logical flow through hardware and software components or layers in connection with issuing data storage management command to and/or from a data storage system, and also receiving responses (possibly including requested data) to such control or management commands. For example, with reference to FIG. 1, the control commands may be issued from data storage management software executing on management system 22a to the data storage system 12. Such commands may be, for example, to establish or modify data services, provision storage, perform user account management, and the like. For example, commands may be issued over the control path to provision storage for LUNs, create a snapshot, define conditions of when to create another snapshot, define or establish local and/or remote replication services, define or modify a schedule for snapshot or other data replication services, define a RAID group, obtain data storage management and configuration information for display in a graphical user interface (GUI) of a data storage management program or application, generally modify one or more aspects of a data storage system configuration, list properties and status information regarding LUNs or other storage objects (e.g., physical and/or logical entities in the data storage system), and the like.

The data path and control path define two sets of different logical flow paths. In at least some of the data storage system configurations, at least part of the hardware and network connections used for each of the data path and control path may differ. For example, although both control path and data path may generally use a network for communications, some of the hardware and software used may differ. For example, with reference to FIG. 1, a data storage system may have a separate physical connection 29 from a management system 22a to the data storage system 12 being managed whereby control commands may be issued over such a physical connection 29. However, it may be that user I/O commands are never issued over such a physical connection 29 provided solely for purposes of connecting the management system to the data storage system. In any case, the data path and control path each define two separate logical flow paths.

An embodiment of a data storage system in accordance with techniques herein may perform different data processing operations or services on stored user data. For example, the data storage system may perform one or more data reduction operations, such as data deduplication and compression, as well as other types of operations or services. Such data reduction operations attempt to reduce the amount of storage needed for storing data on non-volatile backend storage devices (e.g., PDs) with the goal of reducing the cost per unit of storage consumed (e.g., dollar cost per GB of storage). Generally, data deduplication and compression techniques are known in the art and any suitable such technique may be used in an embodiment in accordance with techniques herein. In at least one embodiment, the compression technique may be a lossless compression technique such as an algorithm from the Lempel Ziv algorithm family (e.g., LZ77, LZ78, LZW, LZR, and the like). In at least one embodiment in accordance with techniques herein, data deduplication processing performed may include digest or hash value computation using an algorithm such as based on the SHA-256 hashing algorithm known in the art. Data deduplication generally refers to removing redundant or duplicate data portions. Data deduplication techniques may include looking for duplicate data chunks whereby only a single instance of the data chunk is retained (stored on physical storage) and where pointers or references may be used in connection with duplicate or redundant copies (which reference or identify the single stored instance of the data chunk).

Figure 2A:
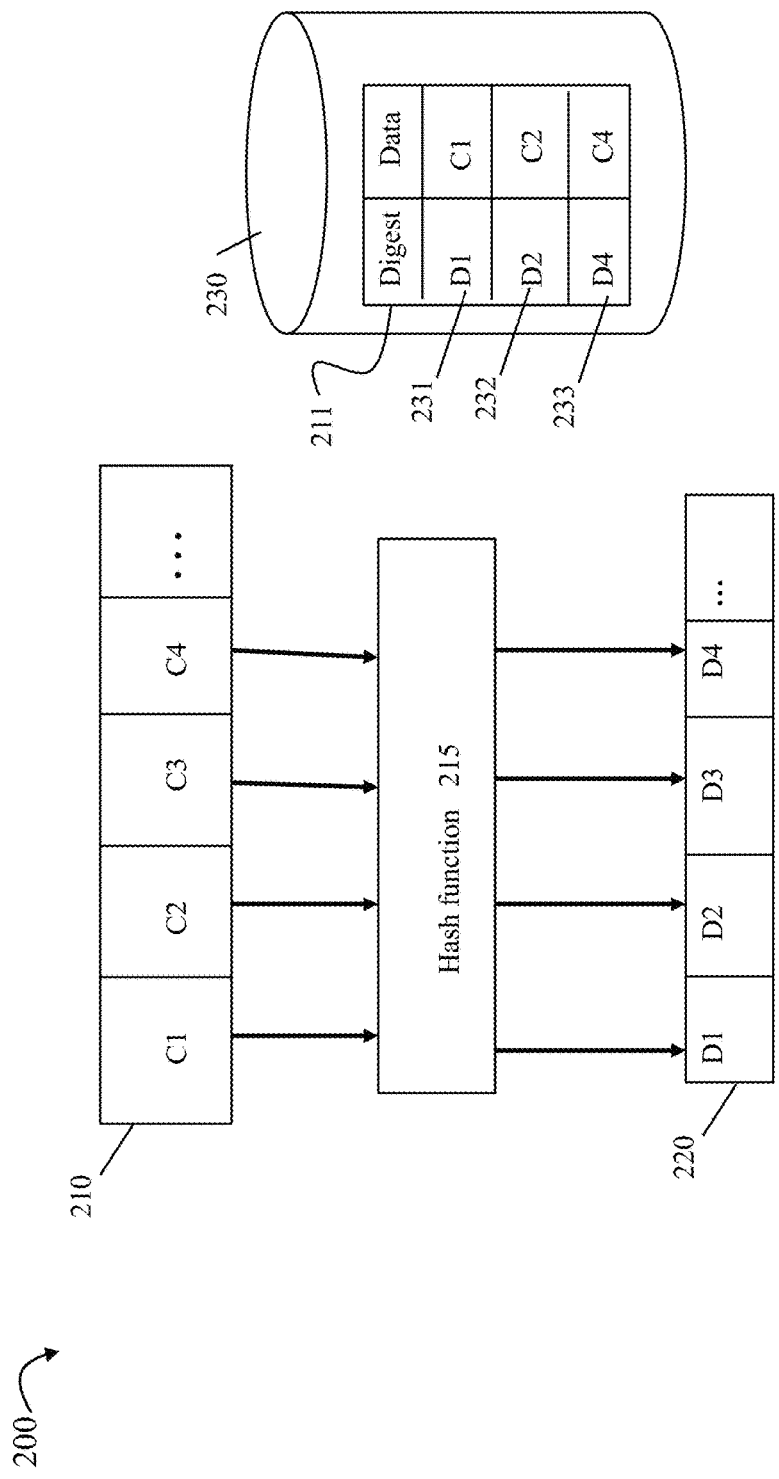
FIG. 2A is an example illustrating data deduplication as may be performed in an embodiment in accordance with techniques herein.

Referring to FIG. 2A, shown is an example 200 illustrating processing that may be performed in connection with data deduplication processing in an embodiment in accordance with techniques herein. Element 210 may denote the original data being written or stored on back-end non-volatile storage. The original data may be partitioned into multiple data chunks C1, C2, C3, C4 and the like. In at least one embodiment and for purposes of illustration, the data chunks may all be the same size where the size may vary with embodiment. As a variation depending on the data deduplication technique utilized, the chunks of 210 may be of varying or different sizes. Each chunk is provided as an input to hash function 215. As noted above, in at least one embodiment, the hash function 215 may be the SHA-256 hashing algorithm, or more generally, any suitable cryptographic hashing function known in the art. For each chunk of 210, the hash function 215 may perform processing and generate, as an output, a hash value or digest. Element 220 includes digests D1, D2, D3, D4, and the like, where a corresponding different one of the digests DN is generated for one of the chunks CN (where "N" is an integer denoting the chunk and associated digest generated for that chunk). For example, D1 is the digest generated for C1, D2 is the digest generated for C2, D3 is the digest generated for C3, and so on. Generally, a hash function 215 is selected which has an acceptably low probability of a "hash collision" of generating the same digest or hash value for two different chunks. The strength of the hash function 215 may be measured by the unlikelihood of a collision occurring two different input chunks of data produce the same digest. The strength increases with the bit length of the hash value or digest. Thus, if two chunks, such as C1 and C3, have the same digests whereby D1=D3, then chunks C1 and C3 match (e.g., are identical matching data chunks). If two chunks, such as C1 and C4, have different digests whereby D1 does not equal D4, then chunks C1 and C4 do not match (e.g., are different or non-matching data chunks). In cases where two matching or identical chunks have the same digest, only a single copy of the data chunk is stored on backend non-volatile physical storage of the data storage system. The single stored instance of the data chunk may be referenced using a pointer, handle, the digest or hash value of the chunk, and the like.

Element 230 of FIG. 2A may denote the data store used to store data chunks. In this example, as noted above, assume chunks C1 and C3 are the same with remaining chunks C2 and C4 being unique. The data store 230 may also be referred to as a single instance store (SIS). In at least one embodiment, element 230 may be organized and managed using a data structure, such as a 211 hash table. In at least one embodiment, computed digests may be used as an index into the hash table 211 where the single unique instances of data chunks may be stored (along with other metadata as may be needed for maintaining the table 211 and also in accordance with the particular hash table management used in an embodiment). Hash tables are data structures known in the art. A hash table uses a hash function to compute an index into an array of entries, buckets or slots (e.g., 231, 232, 233), from which the desired data can be found. In this example, the chunk of data may be mapped by hash function 215, and thus by the chunk's digest, to a particular entry in the table at which the chunk data is stored. To further illustrate, the hash function 215 may be used to generate a digest for a particular data chunk. The digest is then further mapped (e.g., such as by another mathematical function, using particular portions of the digest, and the like) to a particular index or entry of the hash table. The particular mapping used to map the digest to a corresponding table entry varies, for example, with the digest and the size of hash table.

When storing a new data chunk, such as C1, its digest may be mapped to a particular hash table entry 231 whereby if the table entry is null/empty, or otherwise does not already include a data chunk matching C1, then C1 is stored in the table entry along with its associated digest D1 (this is the first time chunk C1 is recorded in the data store 230). Otherwise, if there is already an existing entry in the table including a data chunk matching C1, it indicates that the new data chunk is a duplicate of an existing chunk. In this example as noted above, processing is performed for C1, C2, and C4 respectively, where entries 231, 232, and 233 are added since there are no existing matching entries in the hash table. When processing chunk C3, as noted above, C3 has a digest D3 matching D1 whereby C3 (and thus D3) maps to entry 231 of the hash table already including a matching chunk C1 (so no additional data chunk is added to 230 for C3 since C3 is determined as a duplicate of C1). In connection with representing a particular file or other storage entity including multiple duplicate occurrences of a particular chunk such as C3, the single instance or copy of the data may be stored in 230. Additionally, a handle or reference, such as identifying the hash table entry 231, its digest, and the like, may be used to reference the single instance or copy of the data storage in 230. When reconstructing or restoring data such as the file to its original form, the handle or reference into the hash table for chunk C3 may be used to obtain the actual C3 chunk of data from 230.

Figure 2B:
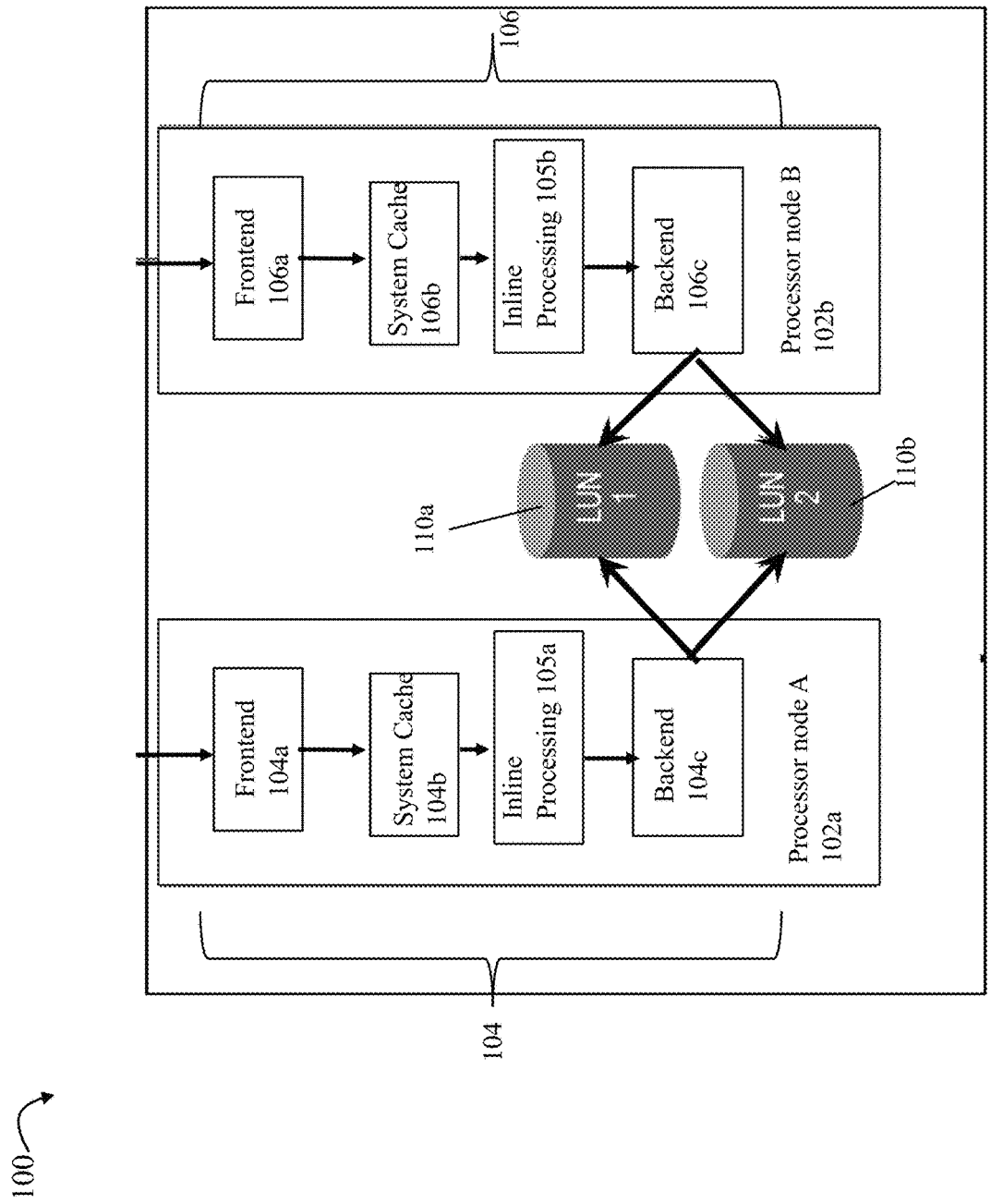

With reference to FIG. 2B, shown is an example 100 illustrating components that may be included in the data path in at least one existing data storage system in accordance with techniques herein. The example 100 includes two processor nodes A 102a and B 102b and associated software stacks 104, 106 of the data path where I/O requests may be received by either processor node 102a or 102b. In the example 200, the data path 104 of processor node A 102a includes: the frontend (FE) component 104a (e.g., an FA or front end adapter) that translates the protocol-specific request into a storage system-specific request; a system cache layer 104b where data is temporarily stored; an inline processing layer 105a; and a backend (BE) component 104c that facilitates movement of the data between the system cache and permanent non-volatile storage (e.g., back end physical non-volatile storage devices accessed by BE components such as DAs as described herein). During movement of data in and out of the system cache layer 104b (e.g., such as in connection with read and writing data respectively, to physical storage 110a, 110b, inline processing may be performed by layer 105a. Such inline processing operations of 105a may be optionally performed and may include any one of more data processing operations in connection with data that is flushed from system cache layer 104b to back-end non-volatile physical storage 110a, 110b, as well as when retrieving data from back-end non-volatile physical storage 110a, 110b to be stored in system cache layer 104b. In at least one embodiment, the inline processing may include performing compression and data duplication. Although in following paragraphs reference may be made to inline processing including compression and data deduplication, more generally, the inline processing may include performing any suitable or desirable data processing operations as part of the I/O or data path (e.g., where such operations may include any of compression and data deduplication, as well as any other suitable data processing operation).

In a manner similar to that as described for data path 104, the data path 106 for processor node B 102b has its own FE component 106a, system cache layer 106b, inline processing layer 105b, and BE component 106c that are respectively similar to components 104a, 104b, 105a and 104c. Elements 110a, 110b denote physical storage provisioned for LUNs whereby an I/O may be directed to a location or logical address to read data from, or write data to, the logical address. The LUNs 110a, 110b are examples of storage objects representing logical storage entities included in an existing data storage system configuration. Since, in this example, writes directed to LUNs 110a, 110b may be received for processing by either of the nodes 102a and 102b, the example 100 illustrates what may also be referred to as an active-active configuration.

In connection with a write operation as may be received from a host and processed by processor node A 102a, the write data may be written to the system cache 104b, marked as write pending (WP) denoting it needs to be written to physical storage 110a, 110b and, at a later point in time, the write data may be destaged or flushed from the system cache to the physical storage 110a, 110b by the BE component 104c. The write request may be considered complete once the write data has been stored in the system cache whereby an acknowledgement regarding the completion may be returned the host (e.g., by component 104a). At various points in time, WP data stored in the system cache is flushed or written out to physical storage 110a, 110b. In connection with inline processing layer 105a, prior to storing the original data on physical storage 110a, 110b, compression and data deduplication processing may be performed that converts the original data (as stored in the system cache prior to inline processing) to a resulting form (that may include compressed and/or deduplicated portions) which is then written to physical storage 110a, 110b. In at least one embodiment, when deduplication processing determines that a portion (such as a chunk) of the original data is a duplicate of an existing data portion already stored on 110a, 110b, that particular portion of the original data is not stored in a compressed form and may rather be stored in its deduplicated form (e.g., there is no need for compression of a chunk determined to be duplicate of another existing chunk). If the original data portion is not a duplicate of an existing portion already stored on 110a, 110b, the original data portion may be compressed and stored in its compressed form on 110a, 110b.

In connection with a read operation to read a chunk of data, a determination is made as to whether the requested read data chunk is stored in its original form (in system cache 104b or on physical storage 110a, 110b), or whether the requested read data chunk was previously deduplicated or compressed. If the requested read data chunk (which is stored in its original decompressed, non-deduplicated form) is in system cache, the read data chunk is retrieved from the system cache 104b and returned to the host. Otherwise, if the requested read data chunk is not in system cache 104b but is stored on physical storage 110a, 110b in its original form, the requested data chunk is read by the BE component 104c from the backend storage 110a, 110b, stored in the system cache and then returned to the host.

If the requested read data chunk was previously deduplicated, the read data chunk is recreated and stored in the system cache in its original form so that it can be returned to the host. If the requested read data chunk was previously compressed, the chunk is first decompressed prior to sending the read data chunk to the host. If the compressed read data chunk is already stored in the system cache, the data is uncompressed to a temporary or buffer location, the uncompressed data is sent to the host, and the buffer or temporary location is released. If the compressed read data chunk is not in system cache but stored on physical storage 110a, 110b, the compressed read data chunk may be read from physical storage 110a, 110b into system cache, uncompressed to a buffer or temporary location, and then returned to the host. Thus, requested read data stored on physical storage 110a, 110b may be stored in a deduplicated or compressed form as noted above where processing is performed by 105a to restore or convert the deduplicated or compressed form of the data to its original data form prior to returning the requested read data to the host.

In connection with techniques herein, each processor or CPU may include its own private dedicated CPU cache (also sometimes referred to as processor cache) that is not shared with other processors. In at least one embodiment, the CPU cache, as in general with cache memory, may be a form of fast memory (relatively faster than main memory which may be a form of RAM). In at least one embodiment, the CPU or processor cache is on the same die or chip as the processor and typically, like cache memory in general, is far more expensive to produce than normal RAM such as may be used as main memory. Processor cache is substantially faster than the system RAM such as used as main memory and contains information that the processor will be immediately and repeatedly accessing. The faster memory of the CPU cache may, for example, run at a refresh rate that's closer to the CPU's clock speed, which minimizes wasted cycles. In at least one embodiment, there may be two or more levels (e.g., L1, L2 and L3) of cache. The CPU or processor cache may include at least an L1 level cache that is the local or private CPU cache dedicated for use only by that particular processor. The two or more levels of cache in a system may also include at least one other level of cache (LLC or lower level cache) that is shared among the different CPUs. The L1 level cache serving as the dedicated CPU cache of a processor may be the closest of all cache levels (e.g., L1-L3) to the processor which stores copies of the data from frequently used main memory locations. Thus, the system cache as described herein may include the CPU cache (e.g., the L1 level cache or dedicated private CPU/processor cache) as well as other cache levels (e.g., the LLC) as described herein. Portions of the LLC may be used, for example, to initially cache write data which is then flushed to the backend physical storage.

When the processor performs processing, such as in connection with inline processing 105a, 105b as noted above, data may be loaded from main memory and/or other lower cache levels into its CPU cache. In particular, inline compression (ILC) and inline data deduplication (ILD) may be performed as part of inline processing 105a, 105b.

Generally, an embodiment may select any suitable size for a data chunk processed by ILC and ILD. For example, in at least one embodiment as discussed elsewhere herein, the size of a data chunk may be 8 KB (kilobytes) or 8192 bytes.

Compression processing such as performed by ILC threads is generally a CPU intensive operation. However, as discussed in more detail herein, there is a relationship between entropy and data compression where a computed entropy value for a data chunk may denote a measure or degree of compressibility of the data chunk. Generally, computation of an entropy value for a data chunk may be characterized as lightweight in terms of CPU requirements as opposed to performing compression processing for the data chunk. In an embodiment in accordance with techniques herein, the computed entropy value for a data chunk may be used in determining whether or not to proceed with compressing the data chunk. The foregoing is generally more CPU efficient than actually compressing each data chunk in order to determine whether or not it (the data chunk) is compressible (and should therefore be stored in its compressed form), or otherwise achieves at least a minimum amount of data reduction (e.g., whether or not a compressed form of a data chunk has a reduced size that is less than the size of the original data chunk by at least a threshold amount) to warrant storing the chunk in its compressed form.

Information entropy may be characterized as the average rate at which information is produced by a stochastic source of data. The definition of entropy used in information theory is analogous to the definition used in statistical thermodynamics. The concept of information entropy was introduced by Claude Shannon in "A Mathematical Theory of Communication", The Bell System Technical Journal (Volume: 27, Issue: 3, July 1948; pages 379-423). The measure of information entropy associated with each possible data value may be expressed as the negative logarithm of the probability mass function for the value. When the data source has a lower-probability value (i.e., when a low-probability event occurs), the event carries more "information" ("surprisal") than when the source data has a higher-probability value. The amount of information conveyed by each event defined in this way becomes a random variable whose expected value is the information entropy. Generally, entropy refers to disorder or non-uniformity. As a metric, an entropy value denotes a measure of the randomness of data, or a random distribution of symbols.

The relationship between entropy and compressibility is discussed, for example, in "Relationship Between Entropy and Test Data Compression", Kedarnath J. Balakrishnan and Nur A. Touba, IEEE Transactions on Computer-Aided Design of Integrated Circuits and Systems, Vol. 26, No. 2, February 2007, pages 386-395, and "Entropy and Compressibility of Symbol Sequences", Werner Ebeling, Phys-Comp96 (Physics and Computation 1996), Feb. 23, 1997, both of which are incorporated by reference herein. As explained in "Relationship between Entropy and Test Data Compression", entropy of a data set is a measure of the amount of information in the data set. Entropy calculations for fully specified data have been used to get a theoretical bound on how much the data can be compressed. In "Relationship between Entropy and Test Data Compression", the concept of entropy is extended for incompletely specified test data that has unspecified or don't care bits. "Entropy and Compressibility of Symbol Sequences" investigates long-range correlations in symbol sequences using methods of statistical physic and non-linear dynamics.

Entropy, H, with respect to a data set may be expressed as:

$$H = -\Sigma_{i=0}^{N-1} P_i \log_2(P_i) \quad \text{EQUATION 1}$$

Where $P_i$ is the probability of occurrence of symbol $X_i$ in the data set;

N is the total number of unique symbols; and $\log_2$ is the base 2 logarithm.

Generally, entropy for the data set depends on the symbol length L. Assume the data set is partitioned into sections where each section includes L bits of data. Thus L denotes number of bits in each section and L also denotes the length of the symbol. For a given symbol length, entropy for the data may be calculated to provide a value that denotes an expected or predicted level of compressibility for the data. Note that $P_i$, the probability of symbol $X_i$, refers to the actual frequency of the symbol $X_i$ in the data set. Thus, $P_i$ for $X_i$ may be calculated as the frequency or number of times $X_i$ appears in the data set divided by the total number of sections in the data set.

It should be noted, although particular values are selected for purposes of illustration, generally the entropy value used with techniques herein may be included for any size data chunk or data set that may include symbols of any suitable number of bits (e.g., any symbol length) having any number of unique symbols.

In at least one embodiment in accordance with techniques herein, L may be 8 where each symbol may include 8 bits (e.g., have a symbol length of 8). In such an embodiment, each symbol or bit pattern of 8 bits denotes a byte of information having a numerical data value (base 10) in the range from 0 to 255, inclusively. In such an embodiment, N, the number of unique symbols (e.g., numerical value of bit patterns) is 256, and EQUATION 1 for calculating entropy, H, may be expressed as:

$$H = -\sum_{i=0}^{255} P_i \log_2(P_i) \quad \text{EQUATION 2}$$

The entropy values calculated using EQUATION 1 and EQUATION 2 are (e.g., real numbers) within the inclusive range of 0 to 8, where 0 denotes the maximum expected level of compressibility of the data set and 8 denotes the minimum expected level of compressibility of the data set. For a given data set, the larger the entropy value (e.g., closer to 8), the more random the data and the less compressible the data set; and the smaller or lower the entropy value (e.g., close to 0), the more uniform the data and the more compressible the data set.

In at least one embodiment, an entropy value may be determined for each 8 KB (kilobyte) chunk of a data set. Thus, each 8 KB chunk includes 8192 bytes (e.g., 8*1024). Generally, the data set may be any defined set of stored data such as, for example, a database, one or more selected portions or logical address space portions of a database, data used by a particular application stored on one or more LUNs, selected portions of one or more LUNs, one or more files, one or more directories, one or more file systems, particular portions of one or more directories or file systems, and the like.

Figure 3:
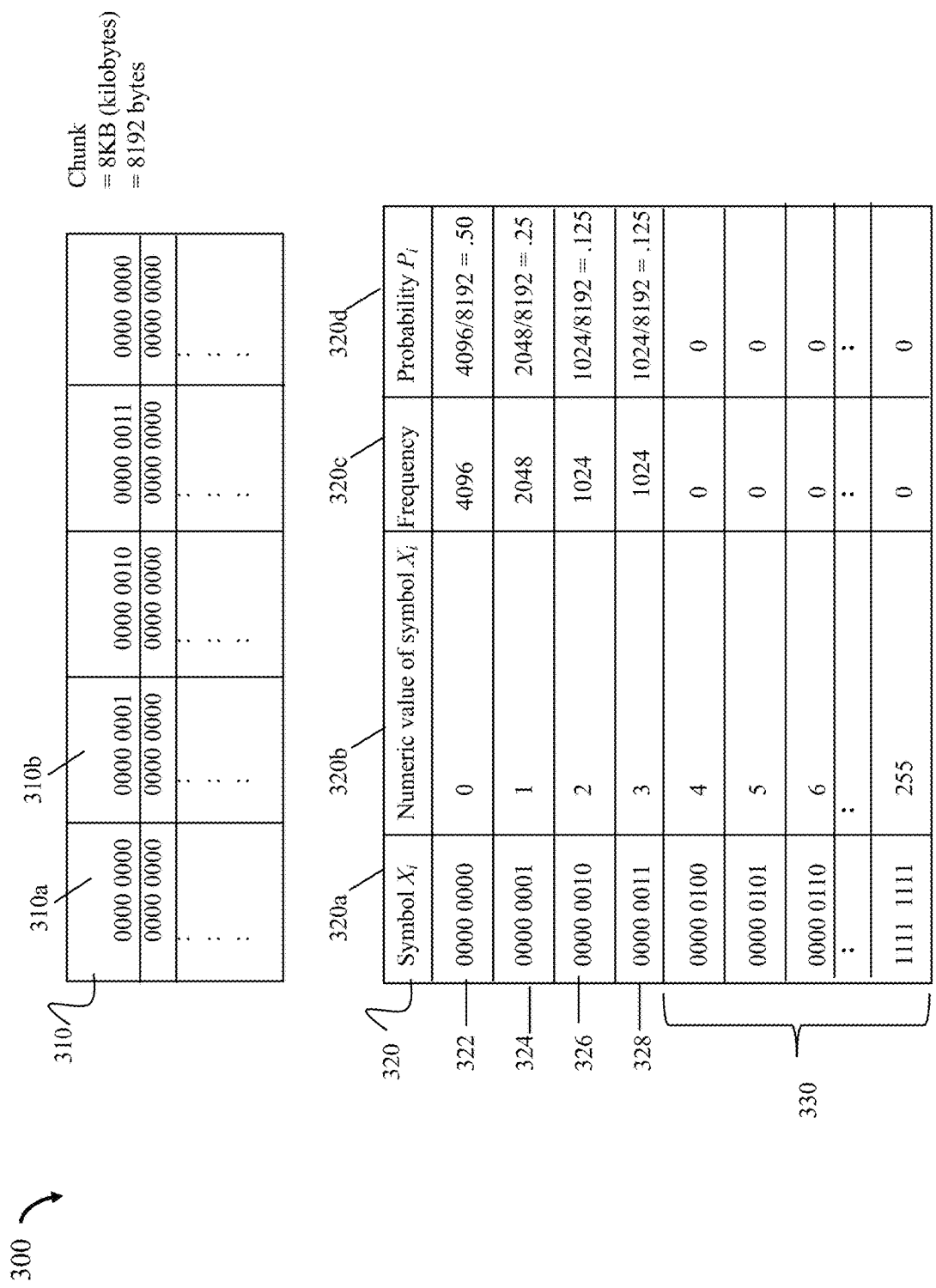
FIG. 3 is an example illustrating a data chunk and associated information that may be used in connection with calculating an entropy value for the data chunk an embodiment in accordance with techniques herein.

Referring to FIG. 3, shown is an example 300 illustrating a data chunk and associated information that may be used in an embodiment in accordance with techniques herein. The example 300 includes data chunk 310 having a size of 8 KB. The data chunk 310 may be partitioned into bytes or 8 bit segments where each byte denotes a symbol having a numeric value from 0 to 255, inclusively. For example, element 310a denotes a byte or symbol having a value of 0 and element 310b denotes a byte or symbol having a value of 1. To calculate the entropy for chunk 310, information in table 320 may be determined. Table 320 includes the following columns: symbol $X_i$ 320a, numeric value of symbol $X_i$ 320b, frequency of $X_i$ 320c and probability $P_i$. Each row of 320 includes a set of information for each unique symbol that can occur in the chunk. Thus, table 320 may include 256 rows, one row for each of the unique symbols having corresponding numeric values from 0 to 255, inclusively. Row 322 denotes that the numeric value 0 for symbol "0000 0000" has a frequency of 4096 and a probability $P_i$=0.50. Row 324 denotes that the numeric value 1 for symbol "0000 0001" has a frequency of 2048 and a probability $P_i$=0.25. Row 326 denotes that the numeric value 2 for symbol "0000 0010" has a frequency of 1024 and a probability $P_i$=0.125. Row 328 denotes that the numeric value 3 for symbol "0000 0011" has a frequency of 1024 and a probability $P_i$=0.125. Element 330 indicates that the remaining symbols each have a frequency=0 and thus a probability $P_i$=0. Based on EQUATION 2 and using the information from table 320 for the chunk 310, the calculated entropy value for chunk 310 is 1.75. Based on the range of possible entropy values from 0 to 8, inclusively, an embodiment may use the entropy value of 1.75 to determine whether or not to compress the chunk 310. For example, consistent with discussion herein, an embodiment may perform the entropy calculation for the chunk 310 inline as part of ILC processing of the I/O or data path, when writing or storing chunk 310 to PDs such as illustrated and described in connection with FIG. 2B. Based on the calculated entropy value for the chunk such as may be performed as part of ILC processing, an embodiment may determine whether to perform compression of the chunk inline as part of the I/O or data path.

In at least one embodiment, an entropy threshold may be specified where a chunk may be characterized as compressible if the chunk has an entropy value less than the specified entropy threshold. Otherwise, the chunk may be characterized as uncompressible/non-compressible. Thus, an entropy value for a data chunk may be used to estimate or determine a theoretical or expected assessment regarding the degree of compressibility/non-compressibility of the data chunk without having to actually compress the data chunk and determine the chunk's compressibility based on actual achieved compression size. As a variation, whether a chunk is compressible or uncompressible may be determined using other techniques such as by actually compressing the chunk and evaluating the amount or rate of data reduction actually achieved by the compression. For example, a chunk may also be characterized as compressible if at least a minimum amount of data reduction in size is achieved such as by comparing the size of the uncompressed form of the chunk to the size of the compressed form of the chunk as a result of compressing the chunk. For example, a chunk that is compressible may be characterized as achieving at least a minimum compression rate or ratio, where the compression rate or ratio may be the ratio of the size of the uncompressed form of the chunk to the size of the compressed form of the chunk as a result of compressing the chunk. If the minimum compression rate or ratio is not achieved, then the chunk may be characterized as uncompressible.

Thus, the computed entropy value for a chunk may be used to determine whether or not the chunk is compressible by comparing the entropy value to a specified entropy threshold. The entropy threshold may denote a maximum allowable entropy level in order for a chunk to be characterized as compressible. Generally, any suitable value for the threshold may be selected. For example, in at least one embodiment, the threshold may be a value within the range of 5.0 to 6.0, inclusively.

Figure 4:
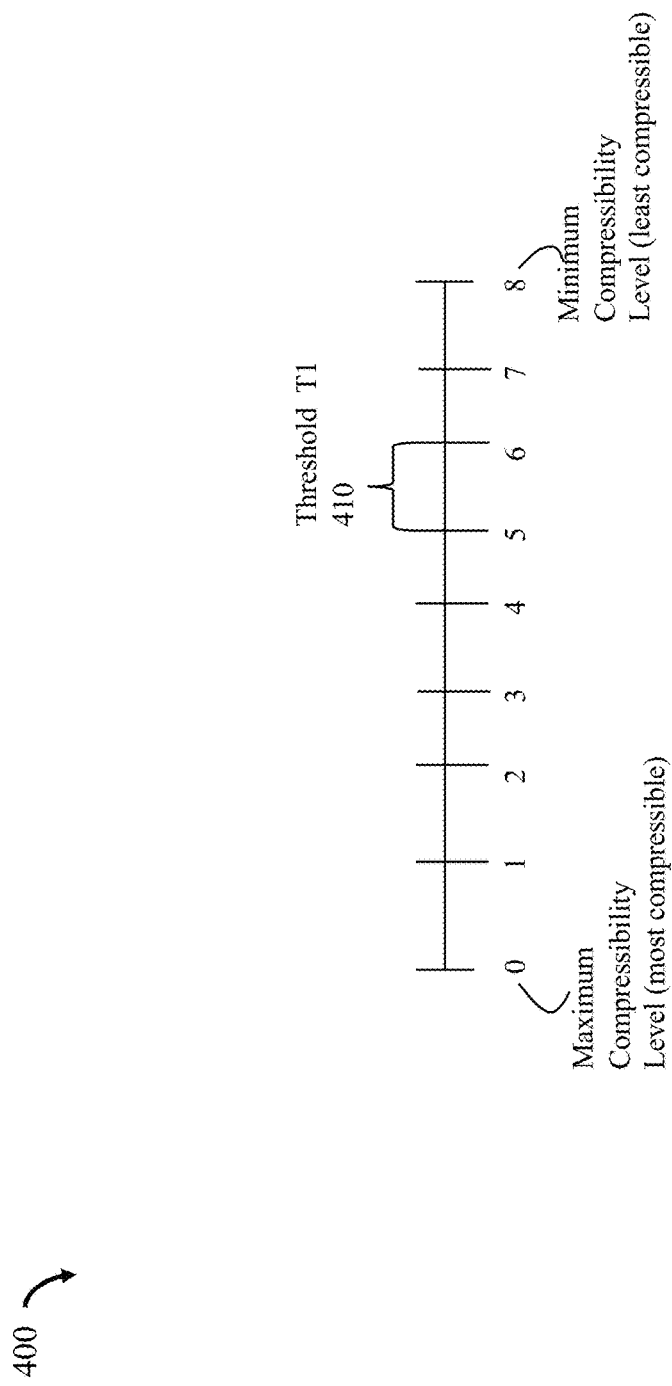
FIG. 4 is an example illustrating selection of an entropy threshold used in an embodiment in accordance with techniques herein.

Reference is made to FIG. 4 illustrating a threshold range within which a threshold for may be selected for use in an embodiment in accordance with techniques herein. The example 400 illustrates the possible range of entropy values from 0 to 8, inclusively where element 410 denotes that the entropy threshold T1 may be a value (e.g., real number) selected within the range of 5.0 to 6.0, inclusively. For example, assume T1 is selected as 6.0 whereby chunks have associated entropy values within the range 0 to 6.0, inclusively, are considered compressible. With reference to the example described above in connection with FIG. 3 for chunk 310 having an entropy value of 1.75, it may be determined that the chunk is compressible. In at least one embodiment in accordance with techniques herein as described below, computation of an entropy value for a data chunk may be performed as part of inline processing of the I/O or data path when writing the data chunk to a data set, servicing the write I/O operation that writes the data chunk and the like. In at least one embodiment in accordance with techniques described herein in more detail below, computation of an entropy value for the data chunk may be performed as part of data deduplication processing, such as part of ILD processing.

As noted above, compression processing such as performed by ILC threads is generally a CPU intensive operation. As also described above, since a computed entropy value for a data chunk may denote a measure or degree of compressibility of the data chunk, such an entropy value may be used in determining whether a chunk is compressible or uncompressible without having to perform the more expensive processing to actually compress the chunk.

In at least one embodiment, a determination of whether a chunk of a data set is compressible or uncompressible may be made in connection with an entropy value determined for the chunk without actually having to compress the chunk. For example, a chunk may be determined as uncompressible if its associated entropy value is greater than a specified entropy threshold as discussed above. As a variation which is more computationally expensive, an embodiment may determine the compressibility of a chunk by actually compressing the chunk. For example, a chunk that is compressible may be characterized as achieving at least a minimum compression rate or ratio, where the compression rate or ratio may be the ratio of the size of the uncompressed form of the chunk to the size of the compressed form of the chunk as a result of compressing the chunk. If the minimum compression rate or ratio is not achieved, then the chunk may be characterized as uncompressible.

Efficiency of data deduplication (e.g., such as may be performed as part of ILD processing) depends on the size of the cache used to store the hash table and the ability to keep in cache as many hash entries and associated information as possible. For example, referring back to FIG. 3, the hash table 211 including hash entries of digests and associated chunks may be stored in cache, such as the system cache 104b, 106b of FIG. 2B. If entries of the hash table used for deduplication are evicted from cache prematurely, deduplication opportunities may be missed. Existing systems may use techniques that optimize hash table management. For example, at least one such technique may attempt to retain the most active or most recently referenced entries of the hash table in cache while evicting less active entries or ones that have not been recently referenced. However, such existing techniques use a hash table with hash entries having the same size hash keys.

Described in following paragraphs are techniques that vary the size of hash keys and hash values or digests used in connection with data deduplication processing for data chunks based on the compressibility determined for the data chunks. In at least one embodiment, compressibility may be determined based on the entropy values of the data chunks (e.g., such as based on computed entropy values expressed in EQUATIONS 1 and 2). More generally, an embodiment may use any suitable technique, such any suitable metric such as entropy, to determine a degree of compressibility of each chunk. For example, in at least one embodiment in accordance with techniques herein, compressibility of chunk may be determined based on actual data reduction achieved by compressing the chunk. For example, consistent with discussion elsewhere herein, a chunk that is compressible may be characterized as achieving at least a minimum compression rate or ratio, where the compression rate or ratio may be the ratio of the size of the uncompressed form of the chunk to the size of the compressed form of the chunk as a result of compressing the chunk. If the minimum compression rate or ratio is not achieved, then the chunk may be characterized as uncompressible. Thus, the compression rate or ratio of a data chunk is an example of another metric that may be used to express a value denoting a level or degree of compressibility of a data chunk. Generally, the more compressible a data chunk is (e.g., the lower the chunk's entropy value or higher the chunk's compression rate), the smaller the hash key and hash value or digest used in connection with the data chunk. Additionally, the less compressible a data chunk is (e.g., the larger the chunk's entropy value or the lower the chunk's compression rate), the larger the hash key and hash value or digest used in connection with the data chunk. Thus, such techniques described in following paragraphs provide for a customized selection of the size of hash keys and hash values or digests in accordance with the degree of compressibility of chunks.

Additionally, techniques herein provide for a more optimized use of cache and allow for caching more hash entries and associated information in cache at a single point in time than existing system not using such techniques. For example, in an existing system not using techniques herein, assume each hash key and hash value or digest is 32 bytes in length. Such an existing system may be able to store a specified number of hash keys into cache at one time. Assume, for example, all the chunks having hash keys and which stored in the table are determined to be highly compressible where a smaller hash key is used, such as a hash key of 16 bytes rather than 32 bytes. In this case, an embodiment in accordance with techniques herein ma store twice the number of hash keys of the hash table in the same size cache as in the existing system using a fixed size hash key of 32 bytes for all entries. Put another way, such an embodiment in accordance with techniques herein may use half the amount of cache to store the same number of hash keys as in the existing embodiment. Additionally, techniques herein may also use an entropy value for a chunk to select and vary the particular digest method or hashing function and algorithm used to generate a hash value or digest for the chunk. The foregoing and other aspects of techniques herein are described in more detail in following paragraphs.

Figure 5:
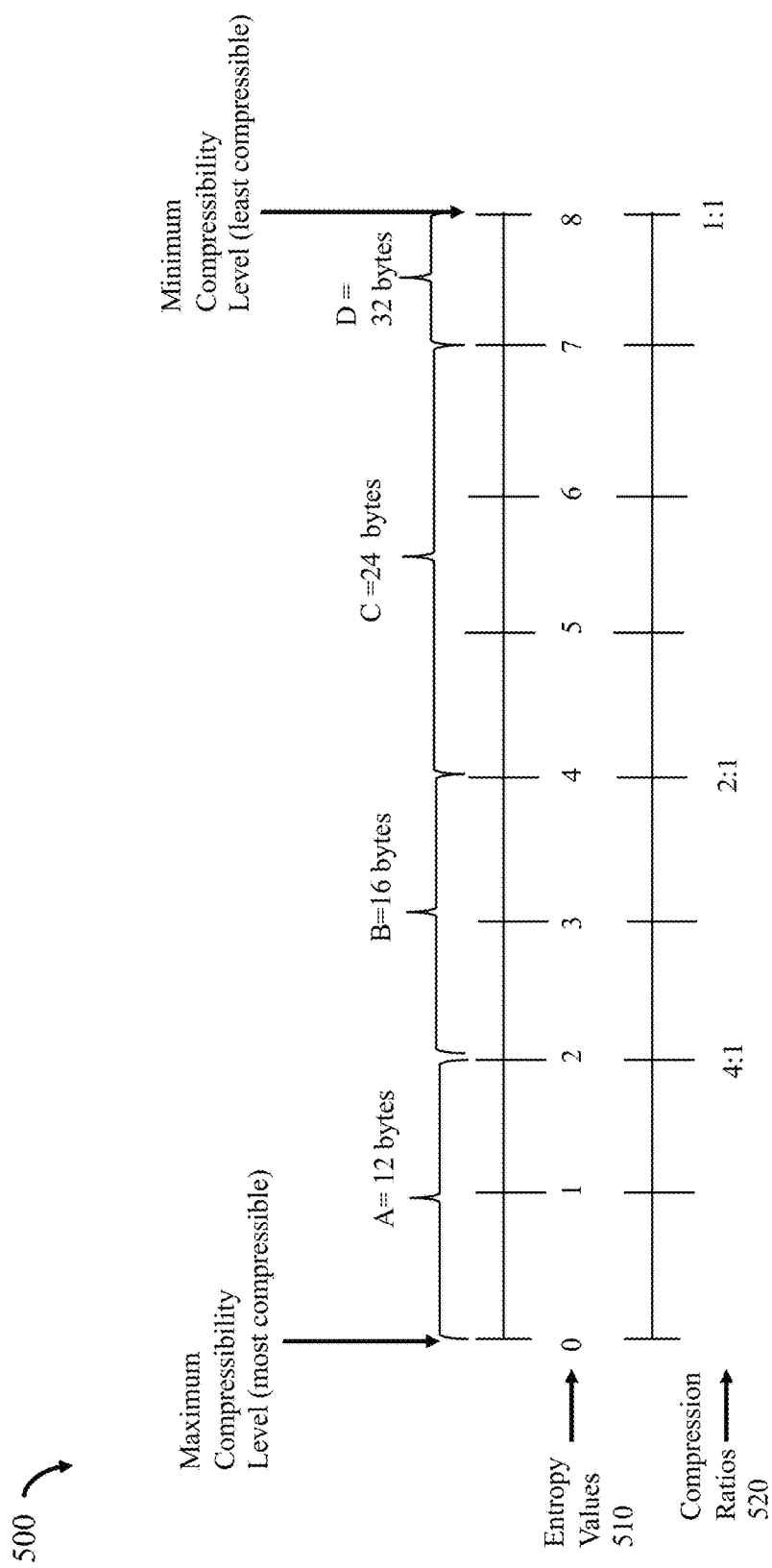
FIG. 5 is an example illustrating use of compressibility in selecting size of hash keys and values in an embodiment in accordance with techniques herein.

Referring to FIG. 5, shown is an example illustrating use of different metrics in connection with assessing the compressibility of a data chunk and in selecting a size of the hash used in connection with the data chunk. The example 500 illustrates use of entropy values 510 as may be determined for different data chunks in connection with selecting a size of hash keys and hash values for such chunk in connection with data deduplication processing. As discussed above, the entropy metric may be as expressed in EQUATIONS 1 and 2. An entropy value for the entropy metric may be determined for a data chunk and may denote a level or degree of compressibility of the data chunk. Entropy values are in the inclusive range of 0 through 8, with 0 denoting the maximum compressibility and 8 denoting the minimum compressibility. Generally, the range of entropy value may be partitioned into multiple buckets, intervals or subranges where each bucket, interval or subrange is mapped to a particular size denoting the size of hash keys and values used for a particular chunk having an associated entropy value falling into the bucket, interval or subrange. The example 500 illustrates 4 subranges A, B, C and D of entropy values 510. However, more generally, an embodiment may partition the range of values, such as entropy values, for the metric denoting compressibility into any suitable number of multiple buckets, intervals or subranges. In this example 500, subrange A may denote entropy values from 0 to 2.0; subrange B may denote entropy values greater than 2.0 and equal to or less than 4.0; subrange C may denote entropy values greater than 4.0 and equal to or less than 7.0; and subrange D may denote entropy values equal to or greater than 7.0 and equal to or less than 8. In this example 500, for a chunk having an entropy value falling into the A subrange, a hash key or hash value size of 12 bytes may be used; for a chunk having an entropy value falling into the B subrange, a hash key or hash value size of 16 bytes may be used; for a chunk having an entropy value falling into the C subrange, a hash key or hash value size of 24 bytes may be used; and for a chunk having an entropy value falling into the D subrange, a hash key or hash value size of 32 bytes may be used.

In this manner, the hash size used for a data chunk may be adapted, customized and selected in accordance with the chunk's level or degree of compressibility, such as may be denoting by the chunk's entropy value. Thus, different size hash keys, such as of the hash table used in connection with data deduplication processing for the chunk, may be used in an embodiment in accordance with techniques herein. The example 500 illustrates selection of one of four different hash sizes (e.g., size of the hash keys of the hash table and size of the hash value of the chunk) that may be used in at least one embodiment in accordance with techniques herein.

Generally, an embodiment may determine the sizes, such as the number of bits or bytes, in each of the different possible hash key sizes as may be needed to distinguish between different hash values of different chunks of a particular data set. An embodiment may increase the size of the hash key, for example, to reduce the number of hash collisions and thus reduce the need for handling hash collisions (e.g., where multiple different chunks result in the same hash value and thus where the multiple chunks map to the same hash table entry). For example, in at least one embodiment, each entry of the hash table may be indexed or mapped to by a unique one of the hash key values. Additionally, the hash function may generate the same hash value for the multiple different chunks (e.g., hash collisions) and thus the same entry of the hash table (identified by the hash value) may be associated with the multiple different chunks. In at least one embodiment, such multiple chunks associated with the same may be differentiated when performing a search to determine whether a new chunk is a duplicate of an existing chunk by actual comparison of new chunk to the multiple data chunks of the same entry.

Thus, in at least one embodiment in accordance with techniques herein, data deduplication processing for a data chunk may include determining the compressibility of the data chunk by calculating the entropy value for the chunk. Based on the chunk's entropy value, the size or length of the hash for the chunk may be selected. The selected hash size may denote the size of the keys used as indices of the hash table. The selected hash size may denote the size of the hash value or digest for the particular data chunk. An example of the hash table used in an embodiment in accordance with techniques herein having multiple different hash sizes for the hash keys is described elsewhere herein.

The example 500 also illustrates use of another metric, a compression ratio 520, as may be determined for different data chunks in connection with selecting a size of hash keys and hash values for such data chunks in connection with data deduplication processing. In connection with an embodiment using entropy values as the metric denoting compressibility, actual compression of the data chunks may be omitted. However, in an embodiment using compression ratio of a data chunk to denote compressibility of the chunk, compression of the chunk is performed to determine the size of the compressed form of the chunk. Subsequently, the chunk's compression ratio may be expressed as the ratio of a first size of the chunk in its uncompressed original form with respect to the resulting size of the chunk in its compressed form. Element 520 denotes the range of compression ratios that may be associated with different corresponding entropy values. For example, a compression ratio of 1:1 means no compression corresponding to an entropy value of 8; a compression ratio of 2:1 means that the resulting compressed form of the data chunk is 50% of the size of its original uncompressed form corresponding to an entropy value of 4; and a compression ratio of 4:1 means the resulting compressed form of the chunk is 25% of the size of the original, uncompressed chunk. Element 520 lists only a few exemplary compression ratios. However, more generally, the range of possible compression ratios 520 also includes other compression ratios than the foregoing few provided for purposes of illustration. Generally, the compression ratio as denoted by 520 is another metric that may be used to identify the level or degree of compressibility of a data chunk. In a similar manner, more generally, any suitable metric, such as percentage of space savings, may be in expressing the degree or level of compressibility of a data chunk. The computation of such a metric may or may not require compression of the data chunk as well as possible other processing that may vary with the metric used.

Figure 6:
FIG. 6 is an example illustrating multiple hash tables using different hash key sizes that may be used in an embodiment in accordance with techniques herein.

Referring to FIG. 6, shown is an example 600 of hash tables that may be used in an embodiment in accordance with techniques herein. The example 600 includes a plurality of tables where each table may use a different size hash key. The example 600 includes four (4) hash tables 602, 604, 606 and 608 where such hash tables may be used in connection with data deduplication for the particular 4 different hash key sizes as described in connection with FIG. 5. Thus, the data deduplication hash table in this example comprises 4 different hash tables. More generally, the number of hash tables (each having a different hash key size) may be determined in accordance with the total number of possible or allowable hash key sizes in an embodiment. For example, if an embodiment partitioned the range of entropy values of FIG. 5 into 8 ranges each associated with a different one of 8 allowable hash key sizes, then the data deduplication hash table may include 8 hash tables each associated with a different one of the 8 allowable hash key sizes.

In the example 600, hash table 1 602 includes entries using a hash key size of 32 bytes; hash table 2 604 includes entries using a hash key size of 24 bytes; hash table 3 6066 includes entries using a hash key size of 16 bytes; and hash table 4 608 includes entries using a hash key size of 12 bytes.

When performing data deduplication processing for a next data chunk in at least one embodiment in accordance with techniques herein, searching for a matching existing chunk to determine whether the next data chunk is a duplicate of an existing chunk already in the hash table is performed with respect to a single one (e.g., one of 602 604, 606 or 608) of the hash tables of 600 that uses a hash key size equal to the hash key size selected for the next data chunk based on the compressibility (e.g., entropy value or compression ratio) of the next data chunk. The remaining hash tables using different hash key sizes than the selected hash key size for the next data chunk are not searched in connection with data deduplication processing for the next data chunk.

In addition to selecting a hash size (e.g., size of hash keys and hash values) in accordance with compressibility (e.g., entropy value or compression ratio) of a data chunk, compressibility may also be used in connection with selecting a hashing function or algorithm used for determining the hash value of the data chunk.

Referring to FIG. 7, shown is an example of the different hash functions or algorithms that may be used in an embodiment in accordance with techniques herein. The example 700 is a table including a first column of hash key sizes 702 and a second column of hash functions or algorithms. The table 700 includes a row for each allowable hash key size 702 and denotes (in column 704 of that same row) the hash function or algorithm used for that allowable hash key size. It should be noted that each of the different hash functions or algorithms in column 704 is a hash function or algorithm known in the art. For example row 710 indicates that the SHA-256 cryptographic hash function may be used for a hash key size of 32 bytes. The SHA-256 hash algorithm generates a 32 byte output that may be used as the digest or hash value for the chunk. Row 712 indicates that the SHA-256 cryptographic hash function may also be used for a hash key size of 24 bytes. In this case, since the SHA-256 hash algorithm generates a 32 byte output, 24 bytes of the 32 byte output may be used as the digest or hash value for the chunk when a 24 byte hash is desired. Row 714 indicates that the MurmurHash non-cryptographic hash function may be used for a hash key size of 16 bytes. MurmurHash is a non-cryptographic hash function known in the art that is suitable for general hash-based lookup. Unlike cryptographic hash functions, non-cryptographic hash functions such as MurmurHash are not specifically designed to be difficult to reverse, making it generally unsuitable for cryptographic purposes but useful and suitable for other purposes such as data deduplication as described herein. MurmurHash has several variants which are in the public domain. In particular, one particular variant, sometimes referred to or known as MurmurHash2, generates a 160-bit or 20 byte hash. Thus, such an algorithm or hash function based on MurmurHash2 may be used to generate the 20 byte hash value for a data chunk. Row 716 indicates that the MurmurHash hash function may also be used for a hash key size of 12 bytes. In this case, since the MurmurHash hash algorithm generates a 20 byte output, 12 bytes of the 20 byte output may be used as the digest or hash value for the chunk when a 20 byte hash size is desired.

Thus, the table 700 includes a row for each of the allowable hash sizes of 12 bytes, 16 bytes, 24 bytes and 32 bytes as denoted, respectively, by the hash sizes selected for compressibility metric subranges A, B, C and D of FIG. 5. Based on the entropy value or other compressibility metric value for a data chunk, techniques herein provide for selecting one of multiple allowable hash sizes (e.g., as described in connection with FIG. 5) and also for selecting one of multiple allowable hash functions or algorithm (e.g., as described in connection with FIG. 7).

As a variation to having multiple possible different hash functions or algorithms as illustrated in FIG. 7, an embodiment may alternatively use a single hash function or algorithm, such as SHA-256, that generates the largest allowable size hash, such as 32 bytes. Subsequently, similar to that as described in connection with row 712, processing may extract a desired number of bytes or bits of the desired hash size from the 32 byte value generated by SHA-256. For example, in such an embodiment, if the hash size selected for a data chunk is 12 bytes, 12 bytes of the 32 byte value generated by SHA-256 may be selected for use as the chunk's hash value or digest.

Figure 8:
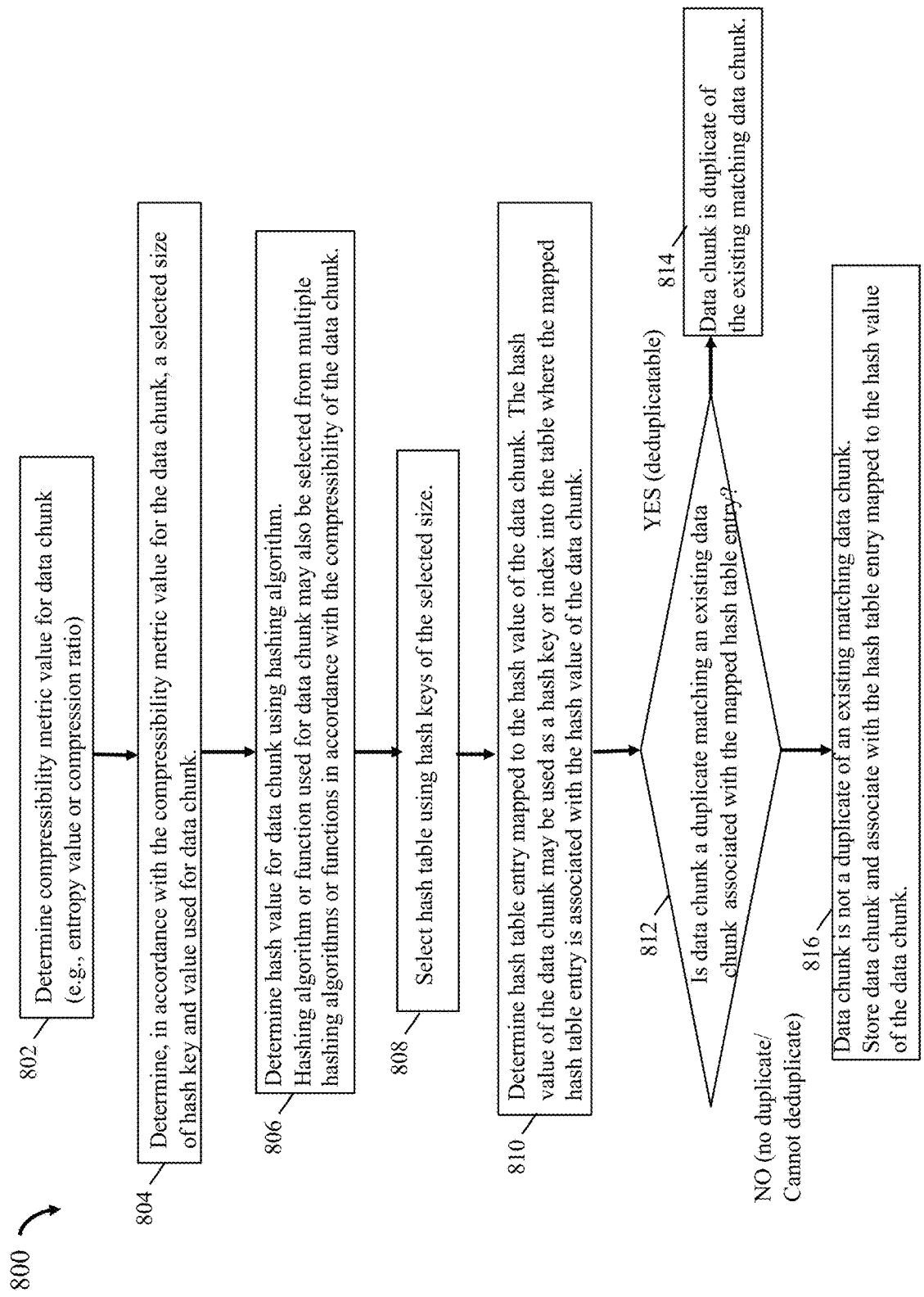
FIG. 8 is a flowchart of processing steps that may be performed in an embodiment in accordance with techniques herein.

Referring to FIG. 8, shown is a flowchart of processing that may be performed in an embodiment in accordance with techniques herein. The flowchart 800 summarizes processing described above for a single data chunk. The processing of flowchart 800 may be performed as part of data deduplication processing, such as part of ILD processing.

At step 802, a compressibility metric for the data chunk is determined. As described herein, examples of a compressibility metric that may be used include entropy and compression ratio. From step 802, control proceeds to step 804. At step 804, processing determines, in accordance with the compressibility metric value for the data chunk, a selected size of the hash key and hash value used for the data chunk. From step 804, control proceeds to step 806. At step 806, the hash value for the chunk may be determined. The hash value has the size selected in step 804. The hash value may be determined using a hashing algorithm or function where the chunk is provided as input to the algorithm or function. Depending the particular embodiment, step 806 may also include selecting the hashing function or algorithm used from multiple allowable hashing algorithms or functions in accordance with the compressibility of the data chunk. Thus, step 806 may include using the entropy value, compression ratio or other metric value from step 802 for the data chunk to select the particular hashing algorithm or function used to compute the chunk's hash value. From step 806, control proceeds to step 808. In step 808, the hash table is selected that uses hash keys that are the size of the selected size from step 802. For example, step 808 may include selecting one of the hash tables of FIG. 6 having a hash key size that matches the selected hash size from step 804 for the data chunk. From step 808, control proceeds to step 810. At step 810, processing is performed to determine the hash table entry mapped to the hash value of the data chunk (e.g., hash value determined in step 806). Consistent with discussion herein, the hash value of the data chunk may be used as a hash key or index into the selected hash table (e.g., selected in step 808) where the mapped hash table entry is associated with the hash value of the data chunk (e.g., hash value determined in step 806). From step 810, control proceeds to step 812 where a determination is made as to whether the data chunk is a duplicate matching an existing data chunk already stored and associated with the mapped hash table entry. Step 812 may include searching a list of one or more chunks, if any, associated with the mapped hash table entry (e.g., entry mapped to the hash value of the data chunk), and determining whether any chunk of the list matches the data chunk being processed. If there is no existing chunk currently that is associated with the mapped hash table entry and that matches the data chunk being processed, step 812 evaluates to NO and determines that the data chunk is not a duplicate of an existing chunk. Thus, the data chunk currently being processed cannot be deduplicated and control proceeds to step 816. In step 816, as noted, it is determined that the data chunk is not a duplicate of an existing matching data chunk already stored in the hash table and data store. In this case, step 816 may include storing the data chunk in the data store and hash table and associating the data chunk with the hash table entry mapped to the hash value of the data chunk. In at least one embodiment, step 816 may include processing that stores the chunk in its compressed form if the chunk is characterized as compressible. Consistent with discussion elsewhere herein, a chunk may be compressible if, for example, its associated entropy value is less than a specified entropy threshold, such as 7. A chunk may also be characterized as compressible as a result of compressing the chunk and evaluating the resulting size of the compressed form of the chunk to determine whether at least a minimum benefit in storage savings is achieved. The foregoing minimum benefit may be determined using any suitable metric or measurements such as, for example, a minimum compression rate or ratio.

In connection with step 812, if there is an existing chunk currently that is associated with the mapped hash table entry and that matches the data chunk being processed, step 812 evaluates to YES and determines that the data chunk is a duplicate of an existing chunk. Thus, the data chunk currently being processed can be deduplicated and control proceeds to step 814. In step 814, as noted, it is determined that the data chunk is a duplicate of an existing matching data chunk already stored in the hash table and data store. In this case, in step 814 there is no need to store the data chunk and associate the chunk with the hash table entry mapped to the hash value of the data chunk. Rather, step 814 processing may include performing additional processing needed for data deduplication that may vary with embodiment and data deduplication technique utilized. For example, step 814 may include updating metadata of the mapped hash table entry and the existing matching data chunk to denote that there are multiple references or uses of the data chunk.

Consistent with other discussion herein, it should be noted that the processing of the flowchart of FIG. 7 may be performed as part of inline processing of the I/O or data path, such as ILD, or may alternatively be performed in connection with a data set offline (e.g., not as part of the I/O or data path when servicing received I/O operations, such as write operations), such as with respect to a data set after the chunks have been written to the data set.

The techniques herein may be implemented using any suitable hardware and/or software, such as executing code using a processor where the code is stored on any one or more different forms of computer-readable media. Computer-readable media may include different forms of volatile (e.g., RAM) and non-volatile (e.g., ROM, flash memory, magnetic or optical disks, or tape) storage which may be removable or non-removable. The processor may be any suitable processor such as, for example, a processor of a computer, data storage system, or other component, such as an ASIC (application specified integrated circuit).

While the invention has been disclosed in connection with embodiments shown and described in detail, their modifications and improvements thereon will become readily apparent to those skilled in the art. Accordingly, the spirit and scope of the present invention should be limited only by the following claims.

What is claimed is:

1. A computer-implemented method of processing data comprising:
   receiving, using a processor, a data chunk;
   determining, using a processor, a metric value denoting a degree of compressibility of the data chunk;
   selecting, using a processor and in accordance with the metric value denoting the compressibility of the data chunk, a first size of a plurality of sizes, wherein the plurality of sizes denote different sizes of hash keys and hash values used in connection with data deduplication processing of data chunks, wherein the first size denotes a hash key size and a hash value size selected for use in connection with the data deduplication processing of the data chunk; and
   performing, using a processor, the data deduplication processing of the data chunk, wherein the data deduplication processing of the data chunk includes using a first hash value of the first size for the data chunk to determine whether the data chunk is a duplicate of a first existing data chunk of a hash table, wherein the first hash value is stored in a storage location of the first size, the hash table includes hash keys of the first size, and wherein the first existing data chunk is associated with a first hash key of the first size, and wherein the data deduplication processing for the data chunk further comprises:
   mapping the first hash value to the first hash key of the hash table matching the first hash value, wherein the first hash key is used an index into the hash table and wherein the first hash key is a value stored in a storage location of the first size; and
   determining whether the first existing data chunk of the hash table matches the data chunk.

2. The computer-implemented method of claim 1, wherein the metric value is an entropy value determined for the data chunk.

3. The computer-implemented method of claim 2, wherein the entropy value denotes a degree of randomness and uniformity of data of the data chunk.

4. The computer-implemented method of claim 1, wherein the metric value is a compression ratio determined for the data chunk.

5. The computer-implemented method of claim 4, further comprising:
   compressing the data chunk using a data compression algorithm; and
   determining the compression ratio for the data chunk in accordance with a size of a compressed form of the data chunk and a size of an uncompressed form of the data chunk provided as an input to the data compression algorithm.

6. The computer-implemented method of claim 1, wherein the data deduplication processing for the data chunk further comprises:
   responsive to determining that the first existing data chunk of the hash table matches the data chunk, determining that the data chunk is a duplicate of the first existing data chunk and not storing the data chunk as another copy of the first existing data chunk; and
   responsive to determining that there is no existing data chunk of the hash table matching the data chunk, performing first processing including determining that the data chunk is not a duplicate of an existing data chunk of the hash table.

7. The computer-implemented method of claim 6, wherein it is determined that there is no existing data chunk of the hash table matching the data chunk, and wherein the first processing further includes:
   associating the data chunk with the first hash key of the hash table; and
   storing the data chunk in a data store.

8. The computer-implemented method of claim 1, wherein the hash table is a first hash table and the data store includes a plurality of hash tables including the first hash table, wherein each of the plurality of hash tables uses hash keys of a different one of the plurality of sizes.

9. The computer-implemented method of claim 6, further comprising:
   using a hash function to generate the first hash value for the data chunk.

10. The computer-implemented method of claim 9, wherein the hash function is one of a plurality of different hash functions and wherein the method includes:
    selecting, in accordance with the metric value denoting the degree of compressibility of the data chunk, the hash function from the plurality of hash functions.

11. The computer-implemented method of claim 9, wherein the hash function outputs values including a first value stored in a first storage location having a storage size larger than said first size and wherein the method includes:
    using a portion of the first value stored in the first storage location as the first hash value for the data chunk, wherein the portion has a size of the first size.

12. The computer-implemented method of claim 1, wherein the method is performed as part of inline processing of the data chunk in connection with an I/O path or data path when servicing an I/O accessing the data chunk.

13. The computer-implemented method of claim 1, wherein the method is performed offline and not as part of inline processing of the data chunk in connection with an I/O path or data path when servicing an I/O accessing the data chunk.

14. A system comprising:
    a processor; and
    a memory comprising code stored thereon that, when executed, performs a method of processing data comprising:
    receiving, using a processor, a data chunk;
    determining, using a processor, a metric value denoting a degree of compressibility of the data chunk;
    selecting, using a processor and in accordance with the metric value denoting the compressibility of the data chunk, a first size of a plurality of sizes, wherein the plurality of sizes denote different sizes of hash keys and hash values used in connection with data deduplication processing of data chunks, wherein the first size denotes a hash key size and a hash value size selected for use in connection with the data deduplication processing of the data chunk; and
    performing, using a processor, the data deduplication processing of the data chunk, wherein the data deduplication processing of the data chunk includes using a first hash value of the first size for the data chunk to determine whether the data chunk is a duplicate of a first existing data chunk of a hash table, wherein the first hash value is stored in a storage location of the first size, the hash table includes hash keys of the first size, and wherein the first existing data chunk is associated with a first hash key of the first size, and wherein the data deduplication processing for the data chunk further comprises:

mapping the first hash value to the first hash key of the hash table matching the first hash value, wherein the first hash key is used an index into the hash table and wherein the first hash key is a value stored in a storage location of the first size; and determining whether the first existing data chunk of the hash table matches the data chunk.

15. A non-transitory computer readable medium comprising code stored thereon that, when executed, performs a method of processing data comprising:

receiving, using a processor, a data chunk;

determining, using a processor, a metric value denoting a degree of compressibility of the data chunk;

selecting, using a processor and in accordance with the metric value denoting the compressibility of the data chunk, a first size of a plurality of sizes, wherein the plurality of sizes denote different sizes of hash keys and hash values used in connection with data deduplication processing of data chunks, wherein the first size denotes a hash key size and a hash value size selected for use in connection with the data deduplication processing of the data chunk; and performing, using a processor, the data deduplication processing of the data chunk, wherein the data deduplication processing of the data chunk includes using a first hash value of the first size for the data chunk to determine whether the data chunk is a duplicate of a first existing data chunk of a hash table, wherein the first hash value is stored in a storage location of the first size, the hash table includes hash keys of the first size, and wherein the first existing data chunk is associated with a first hash key of the first size, and wherein the data deduplication processing for the data chunk further comprises:

mapping the first hash value to the first hash key of the hash table matching the first hash value, wherein the first hash key is used an index into the hash table and wherein the first hash key is a value stored in a storage location of the first size; and determining whether the first existing data chunk of the hash table matches the data chunk.

16. The non-transitory computer readable medium of claim 15, wherein the metric value is an entropy value determined for the data chunk.

17. The non-transitory computer readable medium of claim 16, wherein the entropy value denotes a degree of randomness and uniformity of data of the data chunk.

18. The non-transitory computer readable medium of claim 15, wherein the metric value is a compression ratio determined for the data chunk.

19. The non-transitory computer readable medium of claim 18, wherein the method further comprises:

compressing the data chunk using a data compression algorithm; and determining the compression ratio for the data chunk in accordance with a size of a compressed form of the data chunk and a size of an uncompressed form of the data chunk provided as an input to the data compression algorithm.

20. The non-transitory computer readable medium of claim 15, wherein the data deduplication processing for the data chunk further comprises:

responsive to determining that the first existing data chunk of the hash table matches the data chunk, determining that the data chunk is a duplicate of the first existing data chunk and not storing the data chunk as another copy of the first existing data chunk; and responsive to determining that there is no existing data chunk of the hash table matching the data chunk, performing first processing including determining that the data chunk is not a duplicate of an existing data chunk of the hash table.

* * * * *